(12) United States Patent
Rapakko

(10) Patent No.: US 6,229,354 B1
(45) Date of Patent: May 8, 2001

(54) METHOD AND CIRCUIT ARRANGEMENT FOR SIGNAL PROCESSING

(75) Inventor: Harri Rapakko, Oulu (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/469,204

(22) Filed: Dec. 21, 1999

(30) Foreign Application Priority Data

Dec. 22, 1998 (FI) .......................................... 982775

(51) Int. Cl.$^7$ .................................................. G11C 27/02
(52) U.S. Cl. .................................................. 327/94; 327/91
(58) Field of Search .............................. 327/91, 93, 94, 327/336, 344, 365, 337

(56) References Cited

U.S. PATENT DOCUMENTS

| | | | |
|---|---|---|---|
| 5,148,054 | * | 9/1992 | Demler ..................................... 327/91 |
| 5,408,142 | * | 4/1995 | Takatori et al. ........................... 327/91 |
| 5,867,045 | * | 2/1999 | Ueno et al. ............................... 327/91 |
| 5,945,849 | * | 8/1999 | Yamamoto ............................... 327/91 |

FOREIGN PATENT DOCUMENTS

| | | |
|---|---|---|
| 2935255A1 | 3/1981 | (DE) . |
| 0525798A2 | 2/1993 | (EP) . |
| 0621550 | 10/1994 | (EP) . |
| 841629 | 5/1998 | (EP) . |
| 89838 | 8/1993 | (FI) . |
| 93684 | 1/1995 | (FI) . |
| 101914B | 9/1998 | (FI) . |

* cited by examiner

Primary Examiner—Toan Tran
(74) Attorney, Agent, or Firm—Perman & Green, LLP

(57) ABSTRACT

A method and circuit arrangement for processing analog signals in applications in which low energy consumption is of the essence. An integrator topology where the active charge-transferring element is preferably a source-follower-type transistor in which one input terminal is arranged so as to be substantially independent of the input signal and in which the essential signal path elements of the circuit topology are connected in a fixed manner. Preferably, the circuit arrangement is realized so that it comprises separate transistors for sampling and charge transfer. Thus it is possible to connect an input signal in a fixed manner in an input terminal of the sampling transistor, and an input terminal of the charge-transferring transistor can be connected in a fixed manner to a constant voltage. By using a signal processing circuit according to the invention, it is possible to avoid circuit non-idealities caused by parasitic capacitances.

20 Claims, 10 Drawing Sheets

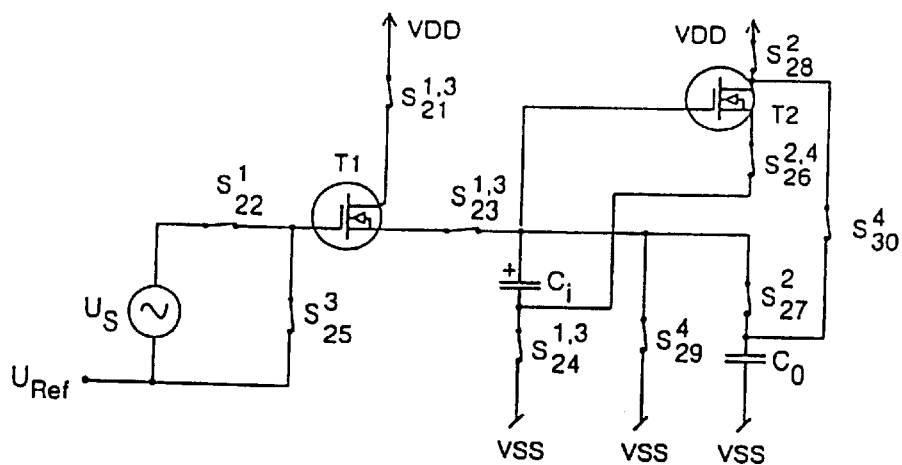
FIG. 1 PRIOR ART
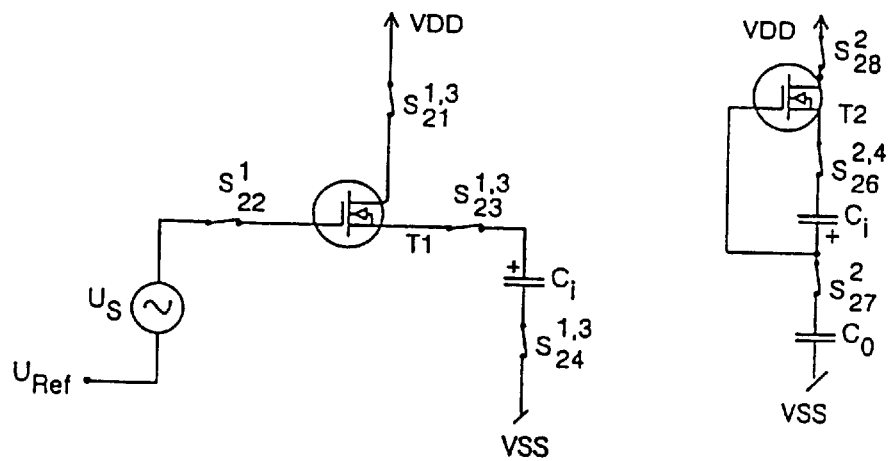
FIG. 2 PRIOR ART
FIG. 3 PRIOR ART
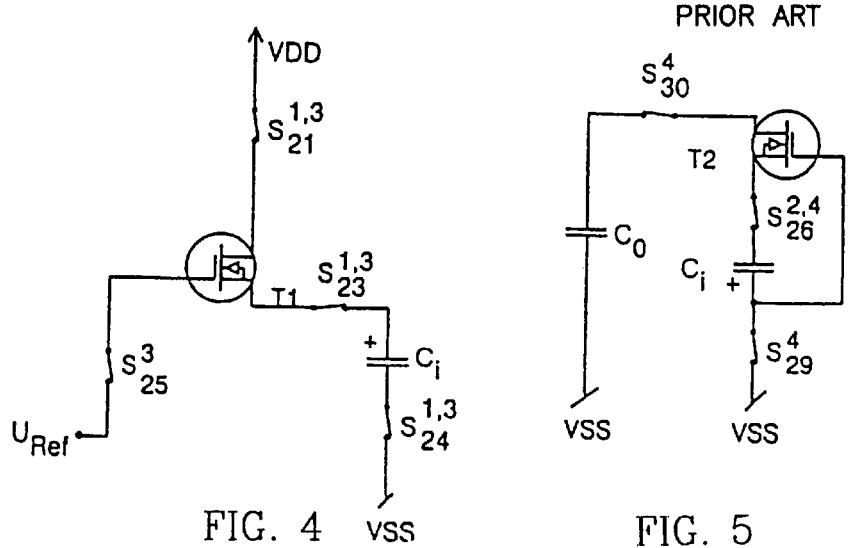
FIG. 4 PRIOR ART
FIG. 5 PRIOR ART

METHOD AND CIRCUIT ARRANGEMENT FOR SIGNAL PROCESSING

FIELD OF THE INVENTION

The invention relates to an improved method and circuit arrangement for signal processing. The invention finds particular utility in the processing of analog signals in applications where low energy consumption is of the essence. Signal processing in the present context refers to addition, subtraction, integration or differentiation of voltages or, for that matter, charges or currents, that represent signals.

BACKGROUND OF THE INVENTION

Processing analog signals often involves the problem of how to achieve low energy consumption as the continuous current consumption of linearly operating active analog circuits, such as e.g. operational amplifiers, is considerable.

Basic methods are known from the prior art wherein the processing of signal samples may be performed by processing the signal by means of a switching transistor that only transfers charge impulses, instead of using structures that continuously consume current. Such methods are disclosed in patent documents FI 89838 (corresponding to EP 473,436 and U.S. Pat. No. 5,387,874), FI 931831 (corresponding to EP 621,550 and U.S. Pat. No. 5,497,116) and finnish patent document FI 101914.

Patent document FI 89838 discloses an integrating circuit wherein switches are used to control the storing in a sampling capacitor of charge samples taken from a signal voltage, and the discharging of charge samples from the sampling capacitor into an integrating capacitor. The circuit disclosed substantially consumes current only while charges are being transferred. The arrangement, however, has the drawback that it requires separate switch arrangements for the positive and negative cycles of the signal voltage as well as separate clock stages to control the switches, thus making the circuit complicated. Moreover, the use of separate circuit elements for the processing of the signal's negative and positive cycles may result in signal distortion caused by threshold voltages and component variation.

The drawbacks of the circuit described above can be avoided by using the arrangement disclosed in patent document FI 931831. To aid in understanding the operation of the present invention and its advantages over the prior art, the operation of the circuit arrangement disclosed in said document is described below in detail with reference to FIGS. 1 to 5.

FIG. 1 shows a signal processing circuit implemented with transistors T1 and T2, in which circuit the end result is a time-discrete integral of voltage $(U_S-U_{Ref})$. Transistors T1, T2 are N-type MOS transistors, or N-MOS transistors. Switches $S_{21}$ to $S_{30}$ in the circuit shown in FIG. 1 are controlled by clock signals 1 to 4. The clock signals 1 to 4 control the switches in four successive stages such that e.g. during clock stage 1 clock signal 1 sets the switches controlled by clock signal 1 into conductive state. Switches are below denoted using the letter S and indices such that the subscript refers to the switch number, which is running, and the superscript refers to the clock stages during which the switch is conductive. F or example, marking $S_{21}^{1,3}$ refers to switch 21 which is conductive during clock stages 1 and 3, controlled by clock signals 1 and 4. During the other clock stages 2 and 4 the switch is non-conductive. Similarly, a denotation of voltage provided with a superscript refers to the voltage appearing during the clock stage indicated by the superscript and a denotation of charge provided with a superscript refers to the charge appearing or transferred during the clock stage indicated by the superscript. Thus, $U_{Ci}^2$ refers to the voltage U of capacitance Ci during the end of clock stage 2. The clock pulses are so-called non-overlapping clock pulses, i.e. during a given stage only the switches intended to be closed during said stage are conductive, and the other switches are o pen.

The operation of the clock stages 1 to 4 in the circuit is described in detail in FIGS. 2 to 5, showing only those elements of the circuit of FIG. 1 that are essential from the point of view of the operation of the clock stage in question. The signs (i.e. polarities, e.g. positive or negative) of the signals and voltages are indicated relative to the ground potential.

FIG. 2 illustrates the operation during clock stage 1. Switches $S_{21}$, $S_{22}$, $S_{23}$ and $S_{24}$ are closed during clock stage 1 so that the charge-transferring capacitor $C_i$, here also called sampling capacitor $C_i$, is charged up to voltage $U_{Ci}^1$:

$$U_{Ci}^1 = U_S^1 + U_{Ref} + U_{th1} \quad (1)$$

where $U_{th1}$ is the threshold voltage of the gate-source voltage of transistor T1. When the gain of transistor T1 is large, the charge transferred to the sampling capacitor $C_i$ comes substantially from the circuit's supply voltage VDD and not from the signal voltage $U_S$.

The operation during the subsequent clock stage 2 is illustrated in FIG. 3. During clock stage 2, switches $S_{26}$, $S_{27}$ and $S_{28}$ are conductive (closed) so that the sampling capacitor $C_i$ supplies gate-source voltage to transistor T2, facilitating flow of current from the positive operating voltage VDD to the integrating capacitor $C_o$. The current flow continues until the sampling capacitor $C_i$ has discharged down to the threshold voltage $U_{th2}$ of the gate-source junction of transistor T2, at which point the current flow stops. So, charge is transferred from the sampling capacitor $C_i$ to the integrating capacitor $C_o$ until the voltage of capacitor $C_i$ has dropped to $U_{th2}$. Thus, during clock stage 2, a charge is transferred from the charge-transferring capacitor $C_i$ to the integrating capacitor $C_o$ according to the equation:

$$\Delta Q^2 = C_i(U_S + U_{Ref} - U_{th1} - U_{th2}) \quad (2)$$

FIG. 4 illustrates the operation of the circuit during clock stage 3 when switches $S_{21}$, $S_{23}$, $S_{24}$ and $S_{25}$ are closed. The sampling capacitor $C_i$ is connected to the reference voltage $U_{Ref}$ via transistor T1 so that capacitor $C_i$ is charged up to voltage $$U_{Ci}^3 = U_{Ref} - U_{th1} \quad (3)$$

FIG. 5 illustrates the operation of the circuit during the last clock stage 4 when switches $S_{26}$, $S_{29}$ and $S_{30}$ are closed. The sampling capacitor $C_i$ supplies gate-source voltage to transistor T2 facilitating flow of current through the sampling capacitor $C_i$ from the integrating capacitor $C_o$ to the lower operating voltage VSS. The current flow continues until the sampling capacitor $C_i$ has discharged down to the threshold voltage $U_{th2}$ of the gate-source junction of transistor T2. The negative charge transferred to the integrating capacitor $C_o$ is then $$66 \ Q^4 = -C_i(U_{Ref} - U_{th1} - U_{th2}) \quad (4)$$

When the gain of transistor T2 is large, as it is in a good bipolar transistor, or near infinite, as it is in a field-effect transistor (e.g. MOS transistor), also the charge transferred at the charge transfer stages comes from the supply voltage (VDD, VSS) and has substantially that precise magnitude which is required to transfer the desired charge from the sampling capacitance $C_i$ to the integrating capacitance $C_o$. The charge transferred during all clock stages 1 to 4 to the output of the circuit at the integrating capacitor $C_o$, totals in the sum of equations (2) and (4), i.e.

$$66 \; Q_{tot}=C_i(U_s+U_{Ref}-U_{ref})=C_iU_s \quad (5)$$

Accordingly, during one cycle Tr of clock stages, i.e. during clock stages 1 to 4, the voltage of the integrating capacitor $C_o$ changes value according to equation (6):

$$\Delta U_{C_o} = \frac{C_i}{C_o}(U_s + U_{Ref} - U_{Ref}) = \frac{C_i}{C_o}U_s \quad (6)$$

Thus, the circuit shown in FIG. 1 becomes a discrete-time, positive signal voltage integrating circuit the time integration weight coefficient of which is $C_i/C_o$. The sign of the integration can be changed to negative by interchanging the order of performance of the aforementioned clock stages 2 and 4, so that the operation according to clock stage 4 is performed after stage 1, and the operation according to clock stage 2 is performed after stage 3. Consequently, the signs of the abovementioned equations (2) and (4) and, thereby, the signs of equations (5) and (6), too, are inverted (positive becomes negative and negative becomes positive). This basic circuit may be varied according to the type of transistor used (NPN, PNP, N-MOS or P-MOS) and according to whether the circuit is to be implemented using one transistor instead of two (T1 and T2 above).

In the prior-art arrangement described above the circuit is substantially currentless after the charge transfer, and the dependence on threshold voltages and non-linearities of circuit elements is minimal. However, when realizing such a circuit using CMOS transistors, the circuit has three significant drawbacks. First, some of the switching transistors float along with the voltages processed, which in real-life implementations results in threshold voltage changes due to the so-called back-gate phenomenon. This shows as non-linearity in the operation of the circuit so that during sampling and transfer of samples a transistor may have different threshold voltages and, on the other hand, the threshold voltages may have differing values with signals of differing magnitudes. Typically, a transistor would float within one volt, approximately, whereby the threshold voltage could vary in the range of a few millivolts. Therefore, as regards the implementation of the method, it would be advantageous to minimize the variation of potential in the transistor.

Secondly, in the circuits of prior-art arrangements the way in which the transistor goes currentless is that the gate voltage drops to the threshold. This happens slowly, since the transistor's gate voltage VGS changes through the charging of capacitance $C_i$, and said charging only occurs through channel resistance, which at the same time grows, approaching infinity. Thus the circuit may be slow and the growing channel resistance also causes noise.

The third drawback related to the prior-art arrangement described above is that the implementation of more than two (e.g. four) different clock signal stages complicates the circuit. Particularly in implementations integrated on silicon chips, the wiring of four clock signal stages requires a substantially greater area than the wiring of two clock stages even if the number of switches were not large. It is thus preferable to aim to minimize the number of clock signal stages required.

The drawbacks mention ed above can be partly avoided using an arrangement disclosed in patent document FI 101914. The operation of the circuit arrangement disclosed in said document is below described with the aid of FIGS. 6 to 8.

The operation of the circuit arrangement shown in FIG. 6 comprises two clock stages used to control switches $S_{61}$ to $S_{64}$ in the circuit. Clock signals 1 and 2 control the switches in two successive stages such that during clock stage 1 clock signal 1 sets the switches ($S_{61}$, $S_{63}$) controlled by clock signal 1 into conductive state. Similarly, during clock stage 2 clock signal 2 sets the switches ($S_{62}$, $S_{64}$) controlled by clock signal 2 into conductive state. To illustrate the operation of the circuit arrangement, FIGS. 7 and 8 separately show the elements relevant to the operation during both clock stages. The superscripts of the symbols representing switches and voltages are numerals indicating clock stages of the circuit arrangement as in the description of FIGS. 1 to 5.

The circuit arrangement according to FIG. 6 is below described using as an example a p-channel field-effect transistor T the threshold voltage of which is $V_T$. The magnitude of the threshold voltage $V_T$ is typically of the order of −0.5 V. The current equations describing the operation of the p-channel FET in the region relevant to the operation of the circuit are as follows:

$$I_D=\tfrac{1}{2}k(V_{GS}-V_T)^2 \quad (7)$$

$$I_D=kV_{DS}(V_{GS}-V_T) \quad (8)$$

A constant-current element $I_c$ used in the circuit produces a substantially constant current $I_c$. However, the operation of the circuit is first examined without the constant-current element $I_c$. During clock stage 1 (FIG. 7) the gate G of the transistor T is connected via switch $S_{61}^1$ to the signal voltage $U_S$ and a first electrode 23 of capacitance $C_i$ via switch $S_{63}^1$ to constant potential $V_r$. A second electrode 24 of the charge-transferring capacitance $C_i$ is connected in a fixed manner to the source S of transistor T. Thus the capacitance $C_i$ is charged up to voltage $$U_{Ci}=U_S-V_T \quad (9)$$

Let first $U_S \leq 0$ so that the absolute value of the voltage $U_{Ci}$ of t he charge-transferring capacitance is greater than the transistor's threshold voltage $V_T$.

During clock stage 2 (FIG. 8) the integrating capacitance $C_o$ is connected in series with the charge-transferring capacitance $C_i$ through switch $S_{62}^2$ and at the same time the voltage $U_{Ci}$ of the charge-transferring capacitance $C_i$ is connected between the source S and gate G of transistor T through switch $S_{64}^2$. The circuit transfers charge from the supply voltage $V_{DD}$ until the voltage of $C_i$ has dropped to $$U_{Ci}^2=U_T \quad (10)$$

The charge transferred corresponds to the voltage change of the charge-transferring capacitance $C_i$ and its magnitude is $$\Delta Q=U_S \cdot C_i \quad (11)$$

If $U_S>0$, the circuit will not operate as described above, because the voltage $U_{Ci}$ of the charge-transferring capacitance will during both clock stages be smaller than the threshold voltage $V_T$ of transistor T and current will not flow during either clock stage. Hence the constant-current element $I_c$ in the circuit. Below it is assumed that the current $I_c$ of the constant-current element is such that the circuit has time to reach balance during each clock stage. As the value of the current of transistor T decreases or increases to value $I_c$ the current flow to the charge-transferring capacitance $C_i$ stops, and from equations (7) and (8) we get the gate voltage corresponding to the cutoff, $$V_{GSI} = V_T - \frac{I_c}{kV_{DS}}(V_T < 0) \qquad (12)$$

assuming that the transistor is operating in the linear, or triode, region. If the transistor were operating in the saturation, or pentode, region, the cutoff voltage would still be constant $V_T$. In practice, the non-linearity according to equation (12) is caused by the fact that $V_{DS}$ varies to an extent comparable to the signal voltage. Since the value of the transistor-specific coefficient k is large, the distortion caused by the non-linear term is only a few millivolts at a signal voltage of 1 V so that below we can assume the current cutoff voltage to be $V_T$. Let it be pointed out here that the transistor in FIGS. 6 to 8 is a PMOS-type transistor. With such a transistor, $V_T < 0$ and the transistor is conductive when $V_{GS} < V_T$.

During clock stage 1, the circuit is as shown in FIG. 7 so that the charge-transferring capacitance is charged up to the voltage $$U_{Ci}^1 = U_S - V_T \qquad (13)$$

If, prior to the clock stage, $U_{Ci} > U_S - V_T$, the constant-current element discharges the capacitance $C_i$ until $U_{Ci}$ reaches the value of equation (13) and during that time the current through transistor T is smaller than $I_c$. During the clock stage, the current through transistor T settles to $I_c$ and is conducted to the constant-current element $I_c$. The current flowing to capacitance $C_i$ is zero when the current of transistor T has stabilized to $I_c$.

If, prior to the clock stage, $U_{Ci} < U_S - V_T$, the current of transistor T rises, exceeding $I_c$, until the voltage $U_{Ci}$ of the charge-transferring capacitance reaches the value according to equation (7). After that, the current settles to $I_c$ which all flows to the constant-current element.

During clock stage 2 (FIG. 8) the integrating capacitance $C_o$ is connected in series with the charge-transferring capacitance $C_i$, and the voltage $U_{Ci}$ of the charge-transferring capacitance, the magnitude of which is in accordance with equation (7), is connected as a control voltage for transistor T, between the gate G and source S of the transistor. If the voltage $U_{Ci} = U_s - V_T < V_T$, transistor T is conducting more current than the value of $I_c$ to the constant-current element $I_c$ and capacitance $C_i$ until the voltage $U_{Ci}$ settles to $V_T$ and the current of transistor T settles to $I_c$. If $U_{Ci} = U_s - V_T > V_T$, the constant-current element discharges the charge-transferring capacitance $C_i$ until its voltage $U_{Ci}$ reaches the value $V_T$. During that time the current of transistor T is momentarily smaller than $I_c$, where it settles when the charge transfer from capacitance $C_i$ or to capacitance $C_i$ has stopped. The charge transferred through the charge-transferring capacitance $C_i$ is transferred to the integrating capacitance $C_o$. The magnitude of this transferred charge is $$\Delta Q = U_s C_i \qquad (14)$$

as in equation (11), which means the circuit cell described serves as an integrator.

The above-described circuit arrangement according to FIGS. 6 to 8 involves some problems:

In filter implementations, the problem is the sensitivity of the topology to parasitic capacitances. In analog-to-digital converter applications, problems are caused by the lossiness of the self-switched charge transfer (SSCT) integrator and by signal distortion. Below it is described with the aid of FIGS. 9 and 10 how the losses and signal distortion come about.

FIG. 9 shows a circuit corresponding to that in FIG. 7 at the first clock stage such that the drawing also shows the parasitic capacitance $C_p$ between the switches and the upper plate of the capacitor, which parasitic capacitance causes the lossiness of the integrator. In FIG. 10 the circuit is shown at the second clock stage.

At clock stage 1, FIG. 9, capacitor $C_p$ is charged up to the reference voltage $V_{ref}$. At clock stage 2, FIG. 10, the parasitic capacitance $C_p$ is connected in parallel with integrator $C_o$, causing the signal charge to be redistributed. The lossiness caused by the phenomenon is mathematically expressed as $$V_{o(n+1)} = \frac{C_i}{C_o + C_p}V_{o(n)} - \frac{C_i}{C_o + C_p}V_{i(n+1)} \qquad (15)$$

$$C_p = \frac{1}{H_o}C_o, \text{ when } C_i = C_o \qquad (16)$$

Minimization of the parasitic capacitance $C_p$ is limited by the maximum ON resistance allowed for the switches, because the parasitic capacitance of a switching transistor can only be reduced by applying a smaller W/L (width/length) ratio, and reducing the W/L ratio increases the channel resistance. Typically, the DC gain $H_o$ of the integrator is of the order of 10 to 20.

In the known SSCT topology, the gate potential of the active transistor is changed at the different clock stages of the circuit. Thus, there is a limit to the increase of the size of the transistor based on signal distortion caused by parasitic capacitances. However, the length of the transistor has to be sufficient in order to reduce the distortion caused by channel length modulation. These contrary design parameters determine the minimum distortion of the topology.

SUMMARY OF THE INVENTION

An object of the invention is to provide an arrangement with which the aforementioned problems related to the prior art can be avoided.

An idea of the invention is to provide an integrator topology where the charge transfer element is preferably a source follower type transistor in which one input terminal is substantially independent of the input signal and where the essential signal path elements of the circuit topology are coupled in a fixed manner. The circuit arrangement according to the invention is preferably realized such that it comprises separate transistors for sampling and charge transfer. Thus it is possible to connect an input signal in a fixed manner to an input terminal of the sampling transistor, and an input terminal of the charge transfer transistor may be connected in a fixed manner to a constant voltage. Also, one pole of the charge-transferring capacitance and one pole of the integrating capacitance are preferably made independent of the input signal by connecting them to a constant potential. Circuit arrangements according to the invention are depicted more closely in the detailed description of the invention.

The DC gain of the new circuit topology according to the invention is more than tenfold compared to the prior-art topology, and, unlike the known topology, the circuit does not have a distortion minimum determined by mutually contradictory dimensioning principles. Moreover, the new topology enables a double operating frequency. The power supply rejection ratio is better than before, and the interaction of successive integrators is smaller than before. These changes make the topology substantially more useful e.g. in sigma-delta modulators and in filters.

Furthermore, the power consumption of the circuit topology may be reduced by means of dynamic transistor biasing. To increase the speed of SSCT cells it is advantageous to bias the active charge-transferring transistor so that the sampling rate during the positive cycle of the signal is primarily determined on the basis of the active transistor's transconductance. During the negative signal cycle the signal settling time is determined by the transistor's bias current. To reduce static power consumption it is advantageous to adjust the bias current dynamically on the basis of the input signal potential. The adjustment may be performed such that at the end of a clock stage the bias current is constant so that the basic assumption about the constancy of the active transistor's gate-source voltage is true. If the sampling rate is high compared to the signal rate, the bias current may be adjusted using a sample taken during the previous clock stage. In that case the bias current may be adjusted directly in proportion to the previous sample. If the input signal changes substantially between samples, it is possible to use bias control based on the polarity of the current sample. Dynamic biasing gives about 70% savings in power consumption. The savings may be bigger if the resistance in the topology is implemented using circuits that compensate for process variation.

A method according to the invention for processing a signal, which method is comprised of steps in which
    a charge-transferring capacitance is switched into functional connection with an input signal,
    during the time that the charge-transfering capacitance is in functional connection with the signal, the charge of the charge-transferring capacitance is changed by a quantity of charge proportional to an instantaneous value of the signal processed,
    the charge-transferring capacitance is switched into functional connection with an integrating capacitance,
    during the time that the charge-transferring capacitance is in functional connection with the integrating capacitance, charge is transferred between the charge-transferring capacitance and the integrating capacitance, and
    the charge of said charge-transferring capacitance is changed by means of a current generated by an active element connected to the charge-transferring capacitance, said current being dependent on the voltage of said charge-transferring capacitance, is characterized in that
    for the duration of said first and second stages one input terminal of said active element is set to a potential which is substantially independent of the input signal.

A method according to the invention for taking a sample from an input signal, in which method the input signal controls the current fed by a sampling transistor to a sampling capacitance, is characterized in that the bias of said sampling transistor is controlled at the beginning of a clock stage on the basis of the value or polarity of the input signal.

A circuit arrangement according to the invention for processing a signal, comprising
    a charge-transferring capacitance,
    at least one active element,
    first switching elements for switching the charge-transferring capacitance into functional connection with an input signal in order to change the charge of said charge-transferring capacitance by a quantity of charge proportional to an instantaneous value of the signal,
    an integrating capacitance,
    second switching elements for switching the charge-transferring capacitance into functional connection with the integrating capacitance in order to transfer charge between the charge-transferring capacitance and the integrating capacitance,
    at least one active element for changing the charge of the charge-transferring capacitance on the basis of the voltage of said charge-transferring capacitance, is characterized in that
    one input terminal of said active element is substantially independent of the input signal.

An arrangement according to the invention for taking a sample from an input signal, which arrangement is comprised of a sampling capacitance and a sampling transistor for transferring to the sampling capacitance a charge sample proportional to the input signal, is characterized in that the arrangement comprises means for controlling the bias of the sampling transistor at the beginning of a clock stage on the basis of the value or polarity of the input signal.

Preferred embodiments of the invention are disclosed in the dependent claims.

BRIEF DESCRIPTION OF THE DRAWINGS

The invention is below described in greater detail with reference to the accompanying drawings in which FIG. 1 shows an integrating circuit according to the prior art in its entirety, FIG. 2 shows reduced the essential parts associated with the operation of the circuit of FIG. 1 during clock stages 1 and 2, FIG. 3 shows reduced the essential parts associated with the operation of the circuit of FIG. 1 during clock stage 3, FIG. 4 shows reduced the essential parts associated with the operation of the circuit of FIG. 1 during clock stages 4 and 5, FIG. 5 shows reduced the essential parts associated with the operation of the circuit of FIG. 1 during clock stage 6.

DETAILED DESCRIPTION OF THE PREFERRED EMBODIMENTS

Figure 6:
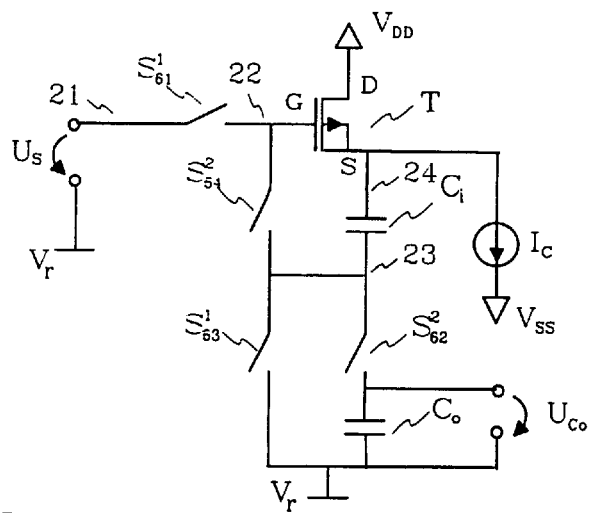
FIG. 6 shows a circuit arrangement with two clock stages.
Figure 7:
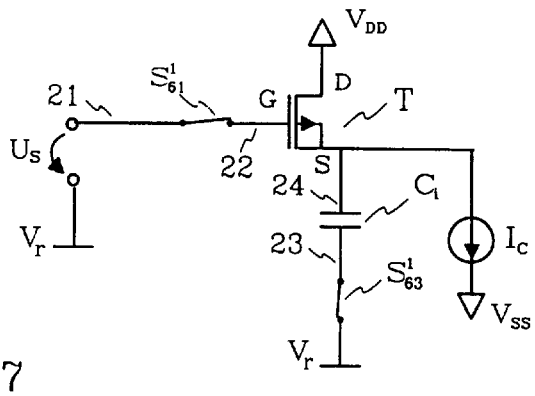
FIG. 7 shows the essential parts associated with the operation of the circuit of FIG. 6 during clock stage 1.
Figure 8:
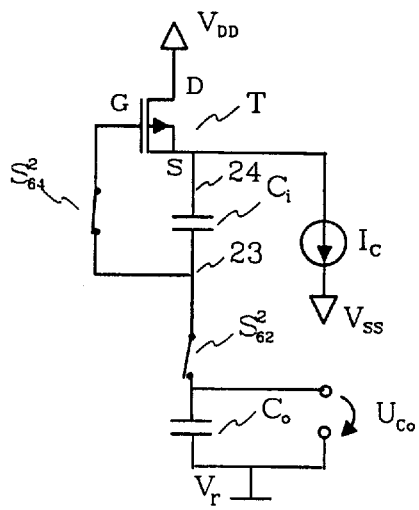
FIG. 8 shows the essential parts associated with the operation of the circuit of FIG. 6 during clock stage 2.
Figure 9:
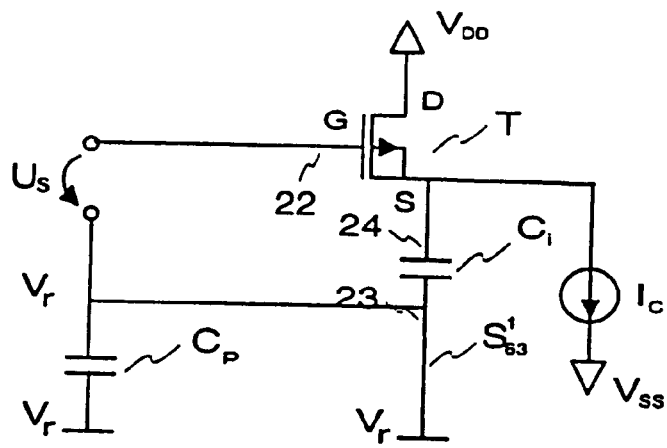
FIG. 9 illustrates the coupling of parasitic capacitance in the circuit arrangement of FIG. 6 during a first clock stage.
Figure 10:
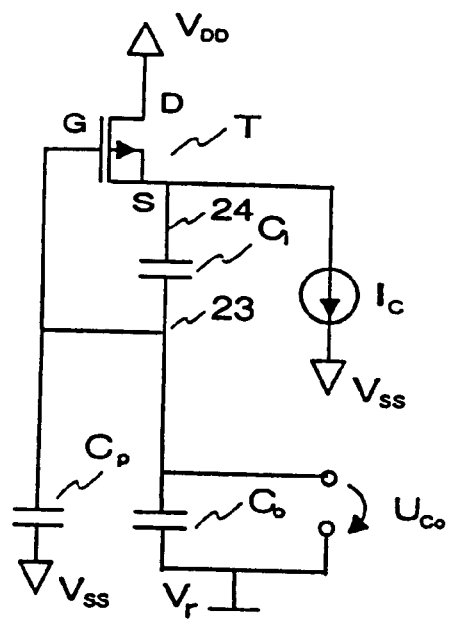
FIG. 10 illustrates the coupling of parasitic capacitance in the circuit arrangement of FIG. 6 during a second clock stage.
Figure 11:
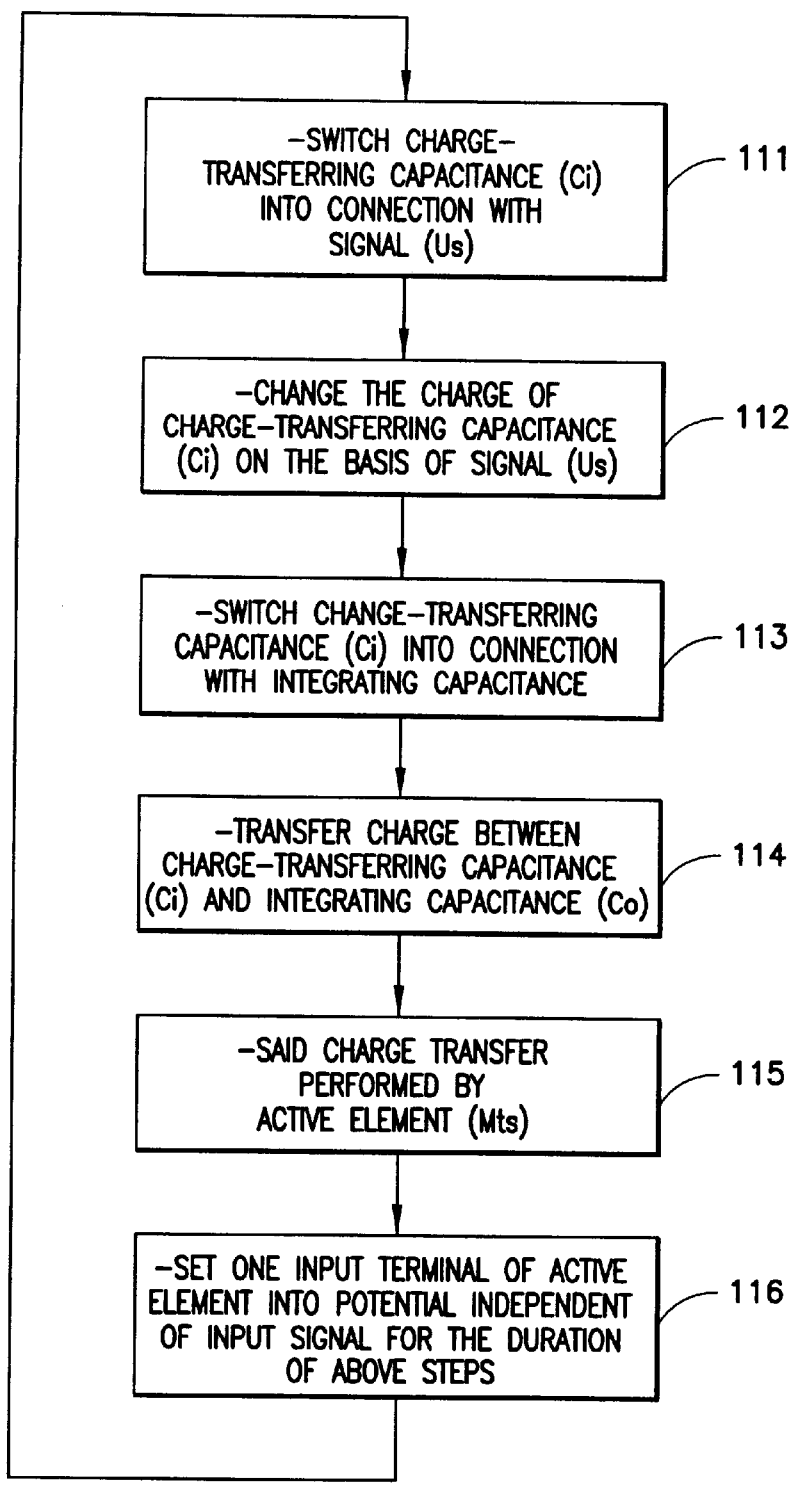
FIG. 11 shows in the form of flow diagram a method according to the invention for processing a signal.

FIG. 11 is a simplified flow diagram of a method according to the invention for processing a signal. At first, in step 111, a charge-transferring capacitance ($C_i$) is switched into functional connection with a signal ($U_s$). Then, during the time that the charge-transferring capacitance ($C_i$) is in functional connection with the signal ($U_s$), the charge of the charge-transferring capacitance ($C_i$) is changed by a quantity of charge proportional to the instantaneous value ($U_s$) of the signal processed, step 112.

In step 113 the charge-transferring capacitance ($C_i$) is switched into functional connection with an integrating capacitance ($C_o$), and in step 114 charge is being transferred between the charge-transferring capacitance ($C_i$) and said integrating capacitance ($C_o$) during the time that the charge-transferring capacitance ($C_i$) is in fuictional connection with the integrating capacitance ($C_o$). In step 115 said charge transfer is being performed by changing the charge of said charge-transferring capacitance ($C_i$) by means of a current generated by an active element ($M_{ts}$) connected to the charge-transferring capacitance, which current is dependent on the voltage ($U_{Ci}$) of said charge-transferring capacitance. Steps 114 and 115 are advantageously simultaneous.

During the aforementioned steps one input terminal of said active element T is kept at a potential which is substantially independent of the input signal, 116. This may advantageously be a constant potential and may also take several values independent of the input signal. During the aforementioned steps one input terminal of the integrating capacitance ($C_o$), too, is kept at a potential substantially independent of the input signal. This, too, is preferably a constant potential and may be the same constant potential to which the input terminal of the active element is connected. In addition, during the aforementioned steps one pole of the charge-transferring capacitance ($C_i$) is advantageously kept at a potential which is substantially independent of the input signal and which is preferably a constant potential.

Figure 12:
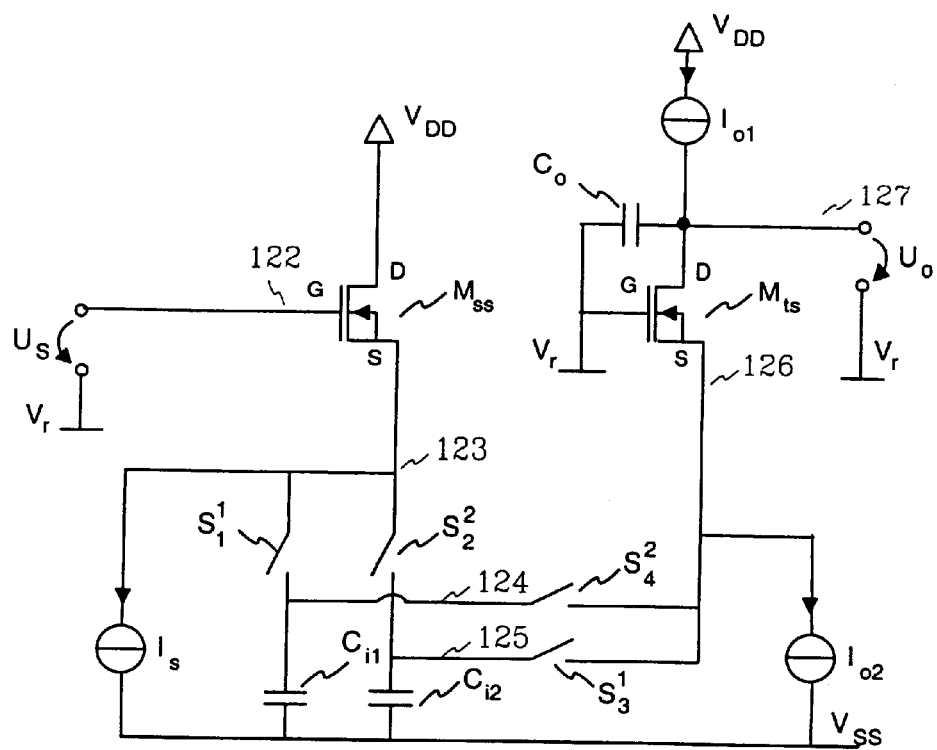
FIG. 12 shows a topology according to the invention in its basic form.

FIG. 12 shows a topology according to the invention. In this topology, sampling and transfer of charge samples is performed using two transistors connected in a fixed manner; transistor $M_{SS}$ that sets the sample into the charge-transferring capacitances $C_{i1}$, $C_{i2}$ and transistor $M_{ts}$ that transfers the sample to the integrating capacitor $C_o$. The integrating capacitor $C_o$ is connected in a fixed manner to the drain of the constant-current-biased source follower $M_{ts}$. It should be noted that instead of one transistor the active elements $M_{SS}$ and $M_{ts}$ may be realized by a circuit comprised of two or more transistors. It should also be noted that the topology may include several signal branches.

The input terminal 122 of the sampling transistor $M_{SS}$ is connected in a fixed manner to an input signal $U_S$. The sampling transistor samples the input signal during both clock stages. At the first clock stage the input signal is sampled into capacitor $C_{i1}$ via switch $S_1$, and during the second clock stage the input signal is sampled into capacitor $C_{i2}$ via switch $S_2$. The use of two capacitors instead of one doubles the maximum clock frequency of the topology. The voltage (124, 125) across the sampling capacitance at the end of a clock stage equals the input voltage minus $V_{teq}$. $V_{teq}$ is the $V_{gs}$ voltage corresponding to bias current $I_{SS}$ of transistor $M_{SS}$.

Similarly, the source 126 of the sample-transferring transistor $M_{ts}$ is connected alternately to charge-transfering capacitances $C_{i1}$ and $C_{i2}$ during opposite clock stages via switches $S_3$ and $S_4$. The magnitudes of the charges transferred between the capacitances, constant-current generators and transistors can be determined according to equations 1 to 14 presented in conjunction with the description of the prior art, so they are not discussed here again.

The current generator is preferably realized using a current mirror. A current mirror may be implemented using any one of several current mirror topologies which are known per se. A change in the bias current as the voltage across the bias current mirror changes, and a change in the voltage across transistor $M_{SS}$ (channel length modulation) result in the changing of the voltage $V_{gs}$ of transistor $M_{SS}$. This leads to signal distortion. Distortion can be minimized by increasing the current generator output impedance and increasing the channel length in the sampling transistor $M_{SS}$. Since the gate 122 of the sampling transistor is connected in a fixed manner to input voltage $U_S$, this can be done without increasing the signal distortion. So, unlike earlier SSCT applications, the topology does not include two mutually contradictory dimensioning principles determining a minimum distortion, so that the distortion can be made substantially smaller than in prior-art arrangements.

The signal is transferred to the integrating capacitance $C_o$ by means of transistor $M_{ts}$ biased by two constant currents $I_{o1}$ and $I_{o2}$. When the sampling capacitor $C_{i1}$ or $C_{i2}$ is switched via switch $S_4$ or $S_3$ to the source of transistor $M_{ts}$, the transistor's voltage $V_{gs}$ deviates from the balanced state by input voltage $U_S$. This causes the current through the transistor to change in such a manner that the source potential returns to the balanced state at the end of the clock stage. The charge will then have been transferred to the integrating capacitance $C_o$. Since the source potential returns to the constant value at the end of the clock stage, the distortion caused by the parasitic capacitance coupled to the node is small. Distortion caused by channel length modulation can be minimized by increasing the channel length in transistor $M_{ts}$. The output impedance of the bias current generator $I_{o2}$ should be comparatively high, lest the change in the source potential affect the bias current. This can be achieved using a cascaded current mirror structure. Similarly, the effect of an output voltage change on the higher bias current $I_{o1}$ must be accounted for.

The topology according to the invention has considerable advantages over the prior-art arrangements. First, compared to earlier SSCT implementations, the integrator topology gives a considerably higher DC gain. While the real DC gain produced by earlier SSCT topologies is of the order of 10 to 20, the topology according to the invention easily achieves a DC gain value of over 200.

The arrangement according to the invention also achieves, as mentioned earlier, smaller signal distortion because in the new integrator topology the transistors $M_{SS}$ and $M_{ts}$ which perform the signal transfer are connected in a fixed manner, which makes it possible to increase the transistor channel length. The signal path is isolated from the supply voltage by current generators with a high output impedance. This increases the power supply rejection ratio PSRR of the topology. While the measured and simulated power supply rejection ratio PSRR in prior-art circuits has been around 40 dB, the PSRR in a simulation performed by the applicant, using the new topology, was 65 dB.

In the new circuit, sampling and charge transfer are performed at both clock stages, which gives the topology an operating frequency which is twice that of known SSCT arrangements. The topology may be realized by means of one sampling capacitor, thus eliminating problems caused by differing capacitances of sampling capacitors and facilitating simple and quick circuit design. Then, however, the maximum achievable operating frequency is only half of the operating frequency achievable with two sampling capacitors.

Moreover, when using the topology according to the invention, the interaction of successive integrators is smaller. The aforementioned improvements are substantially achieved by removing the variation of potential at signal path nodes at the different clock stages of the circuit. As the input and output nodes in the topology are connected in a fixed manner, the gate capacitance of the sampling transistor at the latter stage may be thought of as being part of the integrating capacitance of the preceding integrator. Therefore, also the loss factor of the topology is considerably smaller than in prior-art topologies.

Figure 13:
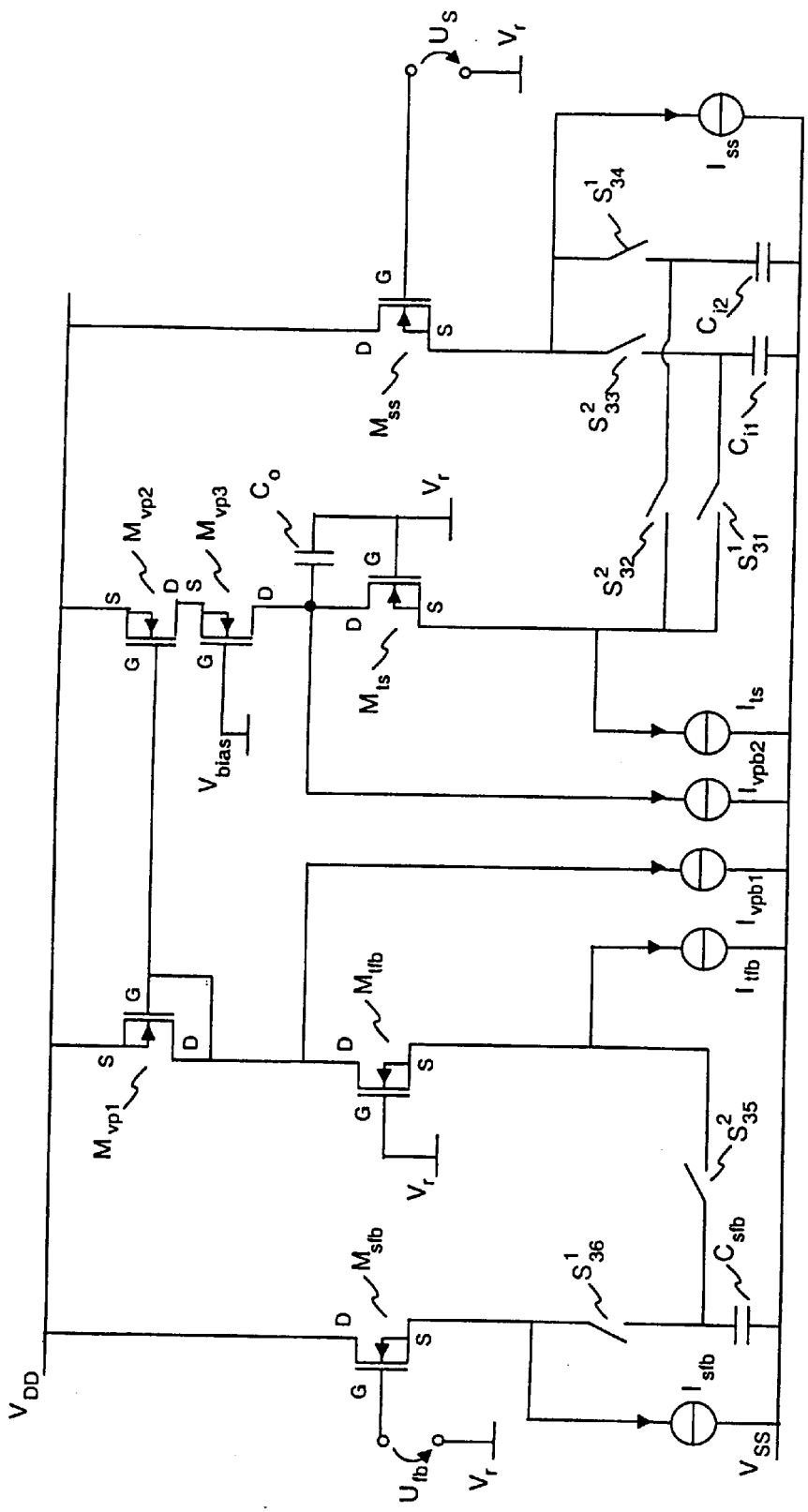
FIG. 13 shows an integrator according to the invention which integrates the difference of two input signals.

FIG. 13 shows a version of the integrator topology according to the invention which includes two inputs. By combining two integrators and replacing the integrators' bias currents with a current mirror in accordance with FIG. 13 an integrator is produced which integrates the difference of two signals. It uses a current mirror comprised of transistors $M_{vp1}$, $M_{vp2}$ and $M_{vp3}$. With the current mirror it is possible to suppress disturbances in the supply voltage as the current mirror takes the effect of the disturbing signal to the other signal branch inverted. Thus it is possible to achieve a good PSRR value. In the integrator of FIG. 13 the inverting input is realized as a single-capacitor arrangement so that the left hand side part of the circuit operates at double clock frequency compared to the right hand side part. The topology in question finds utility e.g. in a sigma-delta modulator. The drawback of a double sampling sigma-delta modulator is a steep degradation of noise-shaping characteristics in case the feedback capacitors in the topology are not equal. The easiest way of solving this problem is to use just one sampling capacitor in the feedback branch.

The circuit elements used in the circuit of FIG. 13 correspond to those shown in FIG. 12. In practice, the current-mirroring ratio of the current mirror deviates from 1, which causes signal distortion. By increasing the width and length of the current mirror it is possible to reduce the influence of random fluctuation and to limit the distortion below a certain level. The drawback of this is, however, that it requires more silicon chip area. In a modulator implementation, the mirrored charge signal only takes two discrete values (cf. feedback signals). Thus the distortion problem becomes an offset problem. The effect of a current change between the clock stages of the current mirror can be minimized using two bias currents $I_{vpb1}$ and $I_{vpb2}$. These may be e.g. 1-$\mu$A currents. In that case the transistors of the current mirror will be continually in saturation.

The integrator currents $I_{ts}$ and $I_{SS}$ as well as the transistor channel W/L ratio determine the balanced state source potential of the active transistors in the integrator. If the source potentials are unequal, the integrator will have an offset voltage based on the clock frequency. The offset voltage can be removed by choosing suitable values for currents $I_{ts}$, $I_{SS}$, $I_{vpb1}$ and $I_{vpb2}$ as well as for the channel W/L ratio.

The integrator topology according to FIG. 13 finds particular utility in filter structures and in the sigma-delta modulator. The modulator makes use of the naturally strong back coupling, which makes DC biasing in the topology unproblematic. Integrator characteristics have been tested e.g. by designing a modulator for an audio AD converter in the transmitter side of a mobile station utilizing the integrator topology. The resolution of the converter is 13 bits and sampling rate 16 kHz. According to simulations, the integrators could be used to realize a specifications-meeting modulator with a current consumption of 30 to 50 $\mu$A. The current consumption of the presently used SC implementation is 200 to 300 $\mu$A. In addition, the silicon chip area required for the implementation of the circuit based on the new topology is probably smaller than in earlier SC implementations.

Figure 14:
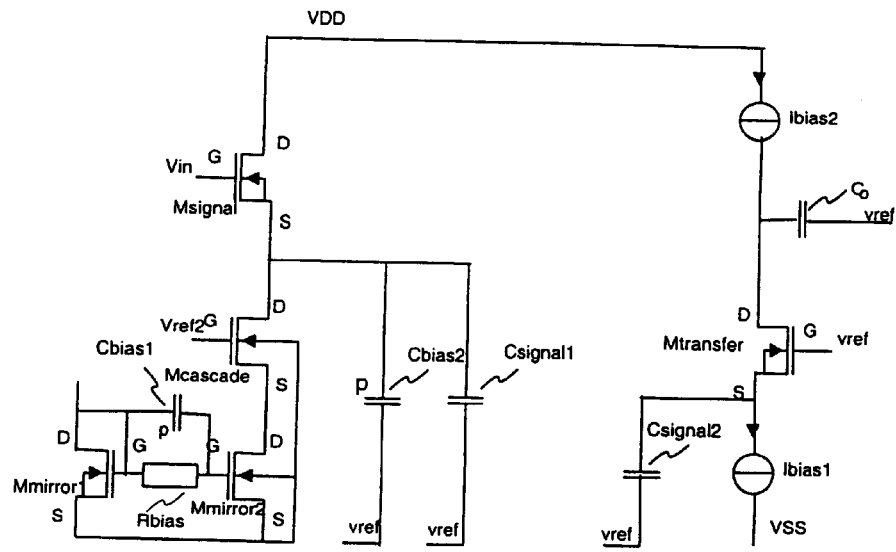
FIG. 14 shows a circuit arrangement according to the invention in which power consumption is reduced by adjusting a bias current on the basis of the potential of an input signal.
Figure 15:
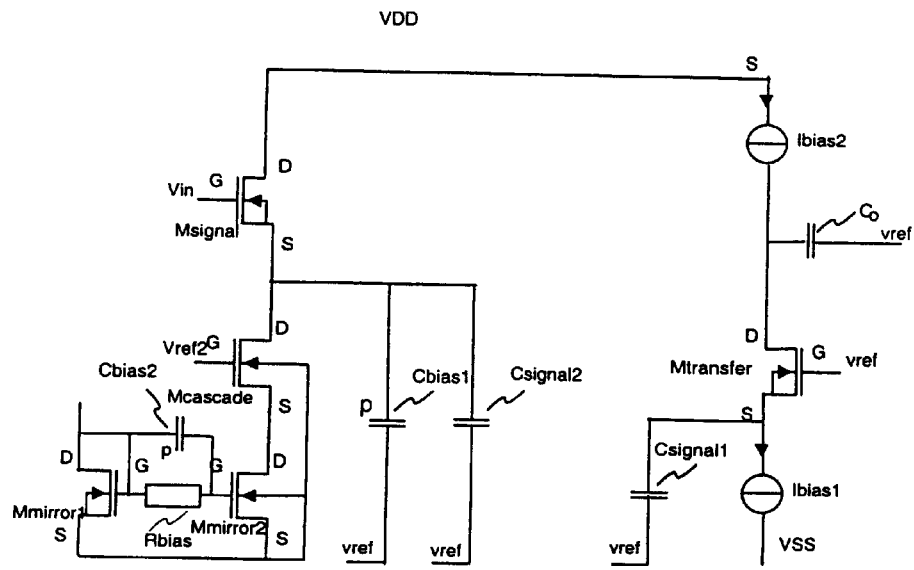
FIG. 15 shows the circuit of FIG. 14 during a second clock stage.

FIGS. 14 and 15 show circuit arrangements according to the invention in which bias current is adjusted on the basis of the input signal potential in order to reduce power consumption. Bias current modulation proportional to the sample signal can be performed using two capacitors operating at alternate stages. At a first clock stage biasing capacitor $C_{bias}$ is connected according to FIG. 14 in such a manner that at the end of the clock stage the voltage across the capacitor is directly proportional to the input voltage. At a second clock stage the capacitor is connected so as to control the output current of the cascaded current mirror functioning as a current generator in such a manner that with a positive input signal the output current of the current mirror is smaller than the constant value, and with a negative input signal the output current of the current mirror is greater than the constant value. This can be realized by connecting the biasing capacitor in parallel with a biasing resistor $R_{bias}$ as in FIG. 15. The resistor and the capacitor must be such that at the end of the clock stage the voltage across the capacitor is zero with sufficient precision so that the current of the current mirror is in accordance with the assumed constant value. Deviation of the current shows as a change in the gate-source voltage of the active transistor. This change in the gate-source voltage can be reduced by making the transconductance of the transistor high. The current generator topology may also be some other topology with an output impedance which is high enough.

Below is described in greater detail the circuit arrangement of FIG. 14 for implementing bias current modulation proportional to the preceding sample. The figures show equivalent circuits of the particular stages and, therefore, do not show the switching elements. The left hand side portion of FIG. 14 shows an ordinary sampling part of an SSCT cell the bias current generator of which is depicted at the component level. On the right there is shown the integrating part in which the bias current generators are depicted symbolically. Transistor $M_{signal}$ is an active transistor functioning as a source-follower and biased by a cascaded current mirror comprised of transistors $M_{mirror1}$, $M_{mirror2}$ and $M_{cascade}$. Two capacitors, $C_{signal}$ and one of capacitors $C_{bias1}$ and $C_{bias2}$, are connected to the source of transistor $M_{signal}$ at the sampling stage. The signal capacitor $C_{signal}$ is the capacitor that actually performs the signal transfer. The purpose of the $C_{bias}$ capacitors is to modulate the output current of the current mirror. Below it is assumed that the input signal is negative ($V_{ref}+V_{in}<V_{ref}$). At the end of stage 1 there is a voltage $V_{in}$ across capacitor $C_{bias2}$ such that the pole marked p has the lower potential. At the second clock stage, FIG. 15, pole p of capacitor $C_{bias2}$ is connected to the gate of a diode-connected transistor. Then the gate potential of the mirroring transistor is momentarily higher than the basic level, and the bias current is larger than the basic level. During the stage, $C_{bias2}$ is discharged via resistor $R_{bias}$. Capacitor $C_{bias1}$ functions in the same way as $C_{bias2}$, but at the opposite clock stage. With a positive input voltage, dynamic biasing decreases the current of the current generator, thus making it possible to reduce the size of transistor $M_{signal}$.

In polarity-dependent modulation of bias current, the biasing capacitor is charged up to the constant potential, the polarity of the connection being determined on the basis of a control signal derived from the input signal. The control signal may be generated from the input signal by means of a comparator, for example. The control signal controls the connection of the biasing capacitor in such a manner that with a negative input signal the instantaneous bias current is larger than the basic level and, conversely, with a positive input signal the bias current is smaller than the basic level. Polarity-dependent modulation of bias current may be used e.g. in feedback sampling in a sigma-delta modulator, whereby the control signal is directly obtainable (modulator output signal), or in the sampling of subsequent signals.

Figure 16A:
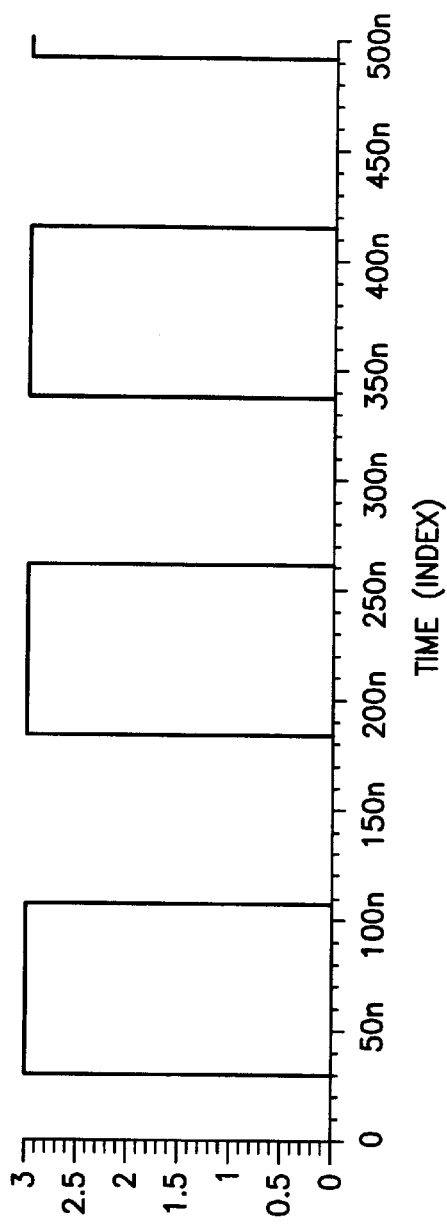
FIGS. 16A, 16B and 16C show signals in the circuits of FIGS. 14 and 15.
Figure 16B:
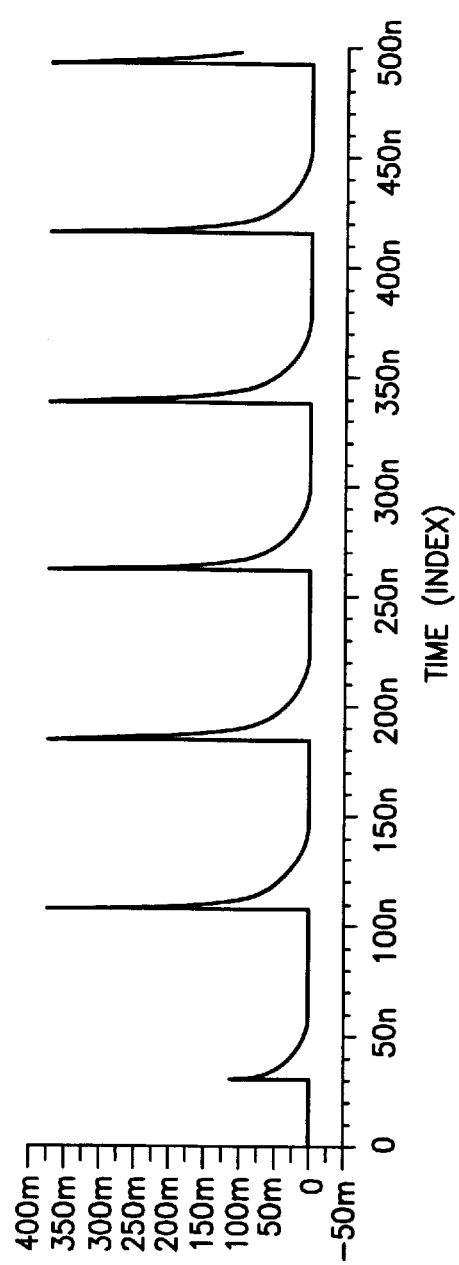
Figure 16C:
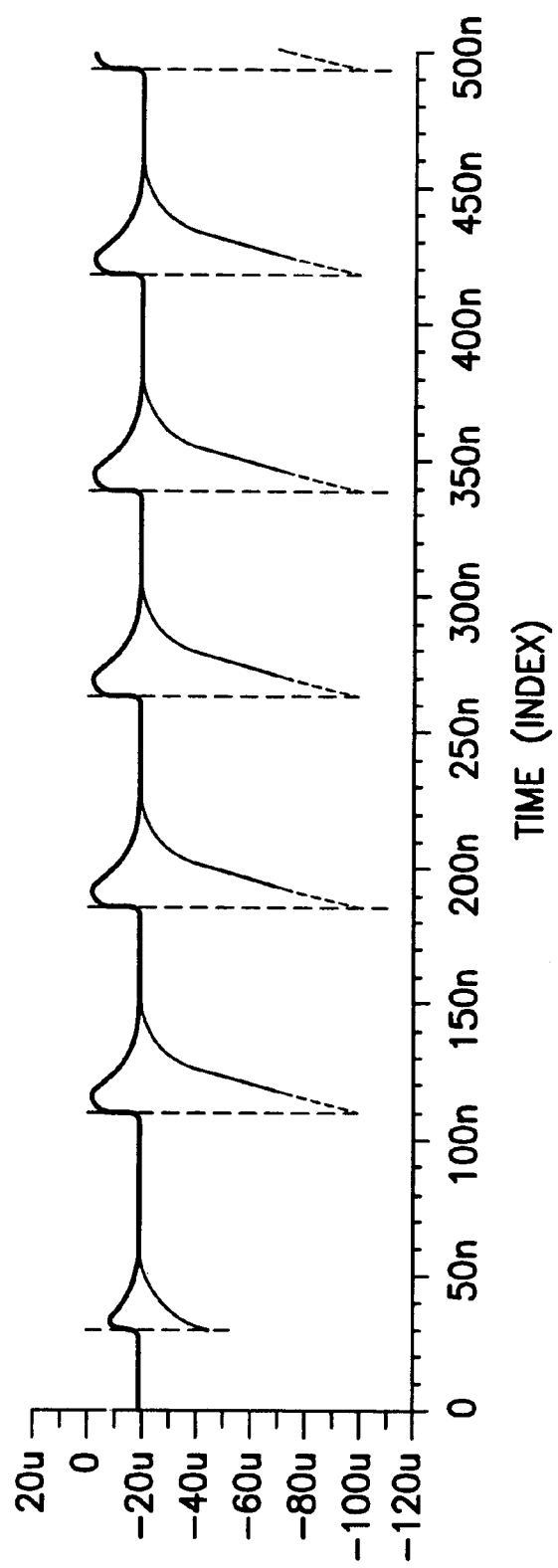

FIGS. 16A, 16B, and 16C show some of the signals of the circuit arrangement of FIGS. 14 and 15 as a function of time. The curve of FIG. 16A represents the clock signal. The curve of FIG. 16B represents the voltage across resistor $R_{bias}$ with a positive input signal. The signal shape shows that the RC time constant is such that the voltage across the resistor drops to zero prior to the end of the clock stage. The small size of the first peak in the graph is caused by erroneous sampling. The reason for it is that during the first clock stage dynamic biasing is not yet functioning and, therefore, the settling of the signal is incomplete. In other words, the voltage across the biasing capacitor is not proportional to the signal but is in accordance with the DC operating point computed by the simulator.

The curve of FIG. 16C shows the bias current with negative and positive input signals. The broken line represents the bias current with a negative input signal and the continuous line represents the bias current with a positive input signal. The figure shows the effect of dynamic biasing especially with a negative input signal. At the beginning of the clock stage the instantaneous charge current is as large as 1.4 mA, but due to the shortness of the charge current peak the samples of the curve shown in the figure do not coincide with the maximum value.

Figure 17:
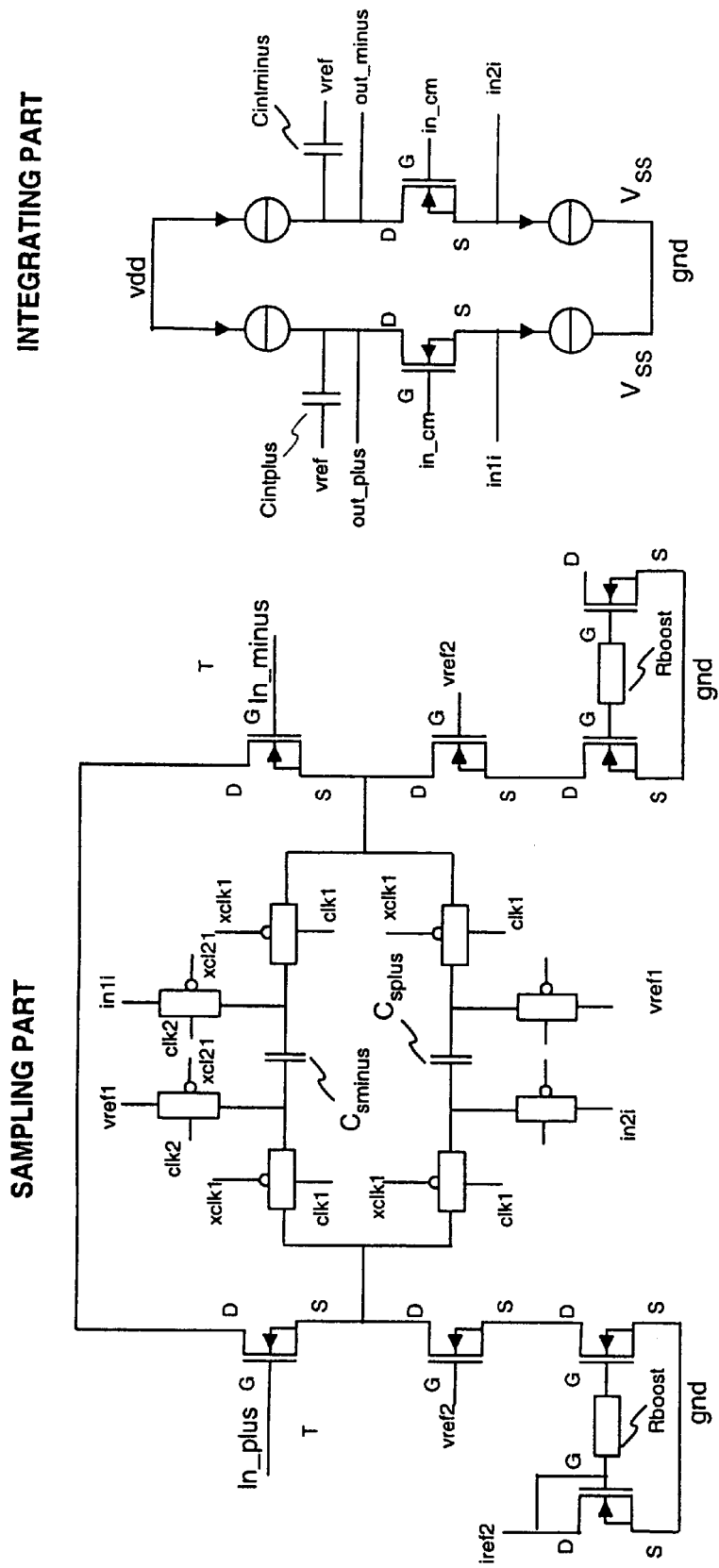
FIG. 17 shows a balanced circuit structure according to the invention.

FIG. 17 shows a balanced structure according to the invention by means of which it is possible to improve the power supply rejection ratio PSRR. Balancing, however, has the drawback that as the signal charge is doubled, so is the power consumption. Implementation of a common-mode feedback in the integrating part increases the power consumption of the circuit to some extent. The increase in power consumption can be reduced using the ground potential as a balancing signal.

A balanced SSCT circuit includes the same structural components as an unbalanced SSCT circuit, so it is not described here in more detail. In the balanced topology, sampling is performed by two source followers with the signal capacitors being connected between their sources. Sampling may also be biased dynamically as described above (boost capacitors are not shown). Correspondingly, the integrating part proper comprises two current-biased source followers connected in parallel. The common-mode feedback in the integrating part may be realized e.g. by modulating the gate voltages of the active transistors in the integrating part. A gate voltage may take e.g. two alternative values which, however, are substantially independent of the input signal.

Figure 18A:
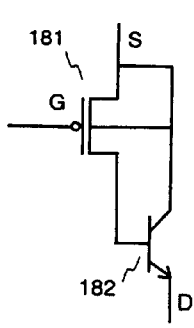
FIG. 18a shows a circuit arrangement for producing by means of two transistors an active element equivalent to a PMOS transistor.
Figure 18B:
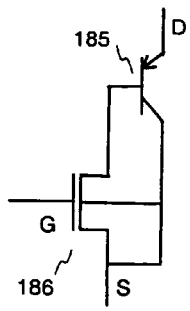
FIG. 18b shows a circuit arrangement for producing by means of two transistors an active element equivalent to an NMOS transistor.

FIGS. 18a and 18b show arrangements for creating an active element by means of two transistors. The nodes designated in the figures correspond to the connection points of an equivalent single-MOS transistor. The circuit in FIG. 18a corresponds to a MOS transistor on a p substrate. The circuit comprises a PMOS-type transistor 181 and an NPN-type transistor 182. The circuit in FIG. 18b corresponds to a MOS transistor on an n substrate, cf. FIGS. 12 to 15 and 17. The circuit comprises a PNP-type transistor 185 and an NMOS-type transistor 186. An active element implemented with two transistors gives considerably more gain than an element realized by one transistor. However, an active element implemented with two transistors requires a slightly higher minimum supply voltage.

In the circuits described above, switching elements may be controlled by suitable means and circuit arrangements known to persons skilled in the art. Thus, for the sake of clarity, these control elements are excluded from the figures and are not described here in greater detail. The switching elements may also be implemented with means known to persons skilled in the art, such means comprising e.g. semiconductor switches. A constant-current element may be realized in a known manner using a transistor, for example. Instead of MOS transistors, the active element in the circuit arrangement according to the invention may comprise e.g. other types of transistors or a cascade connection of a MOS/BJT transistor. The circuit's supply voltages are naturally selected so as to be appropriate with respect to the signal voltages and the components used. If the first supply voltage $V_{DD}$ is positive relative to the constant potential $V_r$, the second supply voltage $V_{SS}$ is advantageously negative relative to the constant potential $V_r$.

The method and signal processing circuit according to the invention find utility e.g. in filters, especially in filters implemented with integrators that can be realized by means of the invention as an integrated circuit or as a component of an integrated circuit. In addition, the invention is advantageously applicable to sigma-delta converters. The signal processing circuit according to the invention can be realized small on a silicon chip, and it consumes little power and is low in noise. For example, the current consumption of sigma-delta converters can be reduced by means of the arrangement according to the invention from the usual about 5 mA to about 300 $\mu$A. The arrangement is thus particularly suitable to radio telephones, e.g. a radio receiver, where filters based on the arrangement may be used e.g. in the receiver's IF and detector circuitry. When using the invention in a radio telephone, the control signals for the switches may be generated from the radio telephone's local oscillator frequency by means of a clock signal generator, for example. The generation of such control signals for switches in a radio telephone is known to a person skilled in the art and is not described here in more detail.

Above were described some embodiments of the method according to the invention. The principle according to the invention, e.g. as regards details of implementation and fields of application, may naturally be modified within the scope of the invention defined by the claims appended hereto.

Therefore, although the arrangement according to the invention was above described so as to realize an integrating circuit, the present invention is not by any means limited to the implementation of an integrating circuit but the circuit arrangement may as well be used to realize other signal processing functions. As patent document FI 93684, the charge-transferrning circuit can easily be changed into an amplifier, differentiator, comparator, etc., and it may be used as a basic component in filters, converters, oscillators and other structural entities used in the field of electronics.

What is claimed is:

1. A method for processing a signal, comprising:
   switching a charge-transferring capacitance into functional connection with an input signal during a first clock stage,
   changing, during the time that the charge-transferring capacitance is in functional connection with the input signal, the charge of the charge-transferring capacitance is changed by a quantity of charge proportional to an instantaneous value of the signal processed,
   switching the charge-transferring capacitance into functional connection with an integrating capacitance during a second clock stage,
   transferring during the time that the charge-transferring capacitance is in functional connection with the integrating capacitance, charge between the charge-transferring capacitance and the integrating capacitance,
   changing the charge of said charge-transferring capacitance by means of a current generated by an active charge-transferring element connected to the charge-transferring capacitance, said current being dependent on the voltage of said charge transferring capacitance, and
   setting, for the duration of said first and second stages one input terminal of said active element to a potential which is substantially independent of the input signal.

2. The method of claim 1, wherein said input terminal of said active element is set for the duration of said first and second stages substantially to a first constant potential.

3. The method of claim 2, further comprising setting one pole of said integrating capacitance to said first constant potential.

4. The method of claim 1, further comprising setting one pole of said charge-transferring capacitance for the duration of said first and second stages to a potential which is substantially independent of the input signal.

5. The method of claim 4, wherein said one pole of said charge-transferring capacitance is set for the duration of said first and second stages substantially to a second constant potential.

6. The method of claim 1, wherein a current changing the charge of said integrating capacitance is substantially a difference of the current generated by said active charge-transferring element and current generated by a first constant current element.

7. The method of claim 1, wherein a current generated by said active charge-transferring element is a sum of currents generated by the charge-transferring capacitance and a second constant-current element.

8. The method of claim 1, wherein the input signal is directed to an input of an active sampling element, and current generated by the active sampling element is a sum of currents generated by the charge-transferring capacitance and a constant-current element in the sampling circuit.

9. The method of claim 1, wherein said charge-transferring capacitance includes a first charge-transferring capacitance and a second charge-transferring capacitance, further comprising:

transferring, during the first clock stage, a charge sample proportional to the input signal to the first charge-transferring capacitance, transferring, during the first clock stage, a charge sample from a second charge-transferring capacitance to the integrating capacitance, transferring, during the second clock stage, a charge sample proportional to the input signal to the second charge-transferring capacitance, and transferring, during the second clock stage, a charge sample from the first charge transferring capacitance to the integrating capacitance.

10. The method of claim 1, wherein signal processing is performed in a balanced manner.

11. A circuit arrangement for processing a signal, comprising:
   a charge transferring capacitance,
   at least one active element,
   first switching elements to switch the charge-transferring capacitance into functional connection with an input signal in order to change the charge of said charge transferring capacitance by a quantity of charge proportional to an instantaneous value of the input signal,
   an integrating capacitance,
   second switching elements to switch the charge-transferring capacitance into functional connection with the integrating capacitance in order to transfer charge between the charge-transferring capacitance and integrating capacitance,
   at least one active element connected to the integrating capacitance for changing the charge of the charge-transferring capacitance in accordance with the voltage of said charge transferring capacitance, and
   one input terminal of said active element arranged so as to be substantially independent of the input signal.

12. The arrangement of claim 11, wherein said one input terminal of said active element is connected to a first constant potential.

13. The arrangement of claim 12, wherein one pole of said integrating capacitance is connected to said first constant potential.

14. The arrangement of claim 11, wherein one pole of said charge-transferring capacitance is arranged so as to be substantially independent of the input signal.

15. The arrangement of claim 14, wherein one pole of said charge transferring capacitance is connected to a second constant potential.

16. The arrangement of claim 11, further comprising:
   a first active element to transfer a charge sample from the input signal to the charge-transferring capacitance, and
   a second active element to transfer a charge sample from the charge-transferring capacitance to the integrating capacitance.

17. The arrangement of claim 16, wherein an input terminal of said first active element is connected in a substantially fixed manner to the input signal.

18. The arrangement of claim 11, further comprising separate elements for processing a differential input signal in a balanced manner.

19. A radio receiver using a method for processing a signal in accordance with claim 1.

20. A radio receiver having a circuit arrangement for processing a signal in accordance with claim 11.

* * * * *